(12) United States Patent
Hyduke

(10) Patent No.: US 6,578,133 B1
(45) Date of Patent: Jun. 10, 2003

(54) MIMD ARRAY OF SINGLE BIT PROCESSORS FOR PROCESSING LOGIC EQUATIONS IN STRICT SEQUENTIAL ORDER

(76) Inventor: Stanley M. Hyduke, 59 Gulf Stream Ct., Las Vegas, NV (US) 89113

( * ) Notice: Subject to any disclaimer, the term of this patent is extended or adjusted under 35 U.S.C. 154(b) by 0 days.

(21) Appl. No.: 09/512,091

(22) Filed: Feb. 24, 2000

(51) Int. Cl.[7] .............................................. G06F 15/16
(52) U.S. Cl. .............................. 712/21; 712/17; 712/19
(58) Field of Search ............................. 712/22, 19, 21, 712/17, 16

(56) References Cited

U.S. PATENT DOCUMENTS

| | | | | |
|---|---|---|---|---|
| 4,380,046 A | * | 4/1983 | Fung | 712/22 |
| 4,992,933 A | * | 2/1991 | Taylor | 712/22 |
| 5,379,444 A | * | 1/1995 | Mumme | 712/11 |
| 5,511,212 A | * | 4/1996 | Rockoff | 712/22 |

FOREIGN PATENT DOCUMENTS

GB  1445714  * 8/1976

* cited by examiner

Primary Examiner—Richard L. Ellis
(74) Attorney, Agent, or Firm—David O'Reilly

(57) ABSTRACT

A system for designing and implementing digital integrated circuits utilizing a set of synchronized sequencers that permit quick and efficient parallel processing of system level designs. The system and method converts digital schematics and hardware description language (HDL) based designs into a set of logic equations and single bit arithmetic-logic operations executed by a set of parallel operating sequencers. The system includes software for converting netlists and HDL designs into Boolean logic equations, and a compiler for distributing these logic equations between multiple sequencers. Each sequencer is comprised of a logic processor and the associated program memory for storing the executable code of the assigned Boolean logic equations and data memory for storing the results of processing of logic equations. To synchronize execution of logic equations by multiple sequencers, all program memories are addressed by one common address register. The processing of logic equations is arranged in such a manner that their outputs can be read by synchronized read instructions in the interconnected sequencers, eliminating any need for control signals.

19 Claims, 7 Drawing Sheets

MIMD ARRAY OF SINGLE BIT PROCESSORS FOR PROCESSING LOGIC EQUATIONS IN STRICT SEQUENTIAL ORDER

FIELD OF THE INVENTION

The present invention relates to digital circuit implementation and more particularly relates to a new silicon device architecture for quick and efficient design and implementation of digital integrated circuits.

BACKGROUND OF THE INVENTION

The art of digital integrated circuit implementation in silicon is well established. There are numerous technologies such as Application Specific Integrated Circuits (ASIC), Field Programmable Gate Arrays (FPGAs) and Complex Programmable Logic Devices (CPLD) which implement digital circuits by means of interconnected cells such as gates, flip-flops and other digital elements. The biggest advantage of these technologies is fast operation caused by parallel activity of all digital elements.

However, the present technologies also have a number of shortcomings that are becoming more noticeable as the cell geometry shrinks and design size increases. For example, the place and route time for such devices increases rather exponentially. The present technologies also require cumbersome and labor intensive critical path timing analysis of the routed designs. This invention eliminates entirely the timing analysis and the design compilation time is linearly proportional to the design size.

The current device architectures that use deep sub-micron silicon technologies require complex analysis of cells and their connections to determine the overall design performance. New physical phenomena are playing larger role at higher cell densities, making the layout analysis continuously more complex. It is becoming now quite apparent that some form of incremental compilation will be necessary for the layout of high density deep sub-micron devices. However, such incremental silicon compilation would require a substantial human effort and involvement, which will slow even more the design process. It is thus another object of this invention to eliminate the device layout, requiring incremental compilation altogether.

Efficient testing of complex devices requires placing additional boundary-scan circuits in the silicon. This makes the design more complex and lowers the effective utilization of silicon surface area. However, since there is no other good way to test the silicon, this process is widely applied to ASIC devices in excess of 100,000 gates. It is yet another object of this invention to provide for effective device testing without the need for any additional boundary scan or similar circuits.

Due to a random nature of cell utilization, relatively large areas of the silicon are set aside to facilitate connections between cells in gate arrays, CPLDs and FPGAs. This lowers the effective utilization of the silicon. The devices built per my invention are based on highly regular memory architecture and do not require design dependent interconnect areas, thus improving the silicon surface area utilization.

The current technologies dissipate a large amount of heat because all circuits operate in parallel. This limits the design size that can be placed on the silicon. This invention describes a parallel-serial circuit operation, which lowers power dissipation and allows considerably higher circuit densities.

The current design methodologies are based more on art than strict mathematical algorithms. As a result, designers must manually tweak some of the circuits for better performance or improved area utilization. This requires high level of expertise, constant employee education and trial and error approach for best results. Another object is to eliminate manual tweaking of designs and lower the expertise demanded from a designer. Since this invention is based on mathematical algorithms, it provides a fully automated design environment, which eliminates manual tweaking of designs and lowers the level of expertise demanded from the designer.

Since the current design tool technology is tuned to the physical phenomena in silicon, designers continuously need to buy newer and more advanced software as technology changes. This invention isolates the designer from changes in the silicon technologies so that one tool set will be able to handle all future silicon process enhancements. Another object is to isolate designs from changes in silicon technology by handling. all future silicon process enhancements with one tool set.

The current silicon production growth outstrips design tool capabilities by a large margin. While the silicon technologies allow building devices with tens of millions of transistors, the current commercial design tools limit that number to around ten million transistors. Because of that, the design tools are a major drag on further spread of silicon device applications. However, the fault is not with the design tools but with the way digital circuits are implemented in silicon. The currently used silicon architectures make design tools unnecessarily slow, cumbersome and difficult to use. It is thus the purpose of this invention to provide such silicon architecture that would facilitate fast and simple design tools, requiring minimum learning and no expertise in device architecture.

Another object of this invention is to eliminate the device layout for each new design, requiring tedious and time consuming incremental compilation.

It is yet another object of this invention to provide for effective device testing without the need for any additional boundary scan or similar circuits.

The devices built per the invention are based on highly regular memory architecture and do not require design dependent interconnect areas, thus improving the silicon surface area utilization.

This invention describes a parallel-serial circuit operation, which lowers power dissipation and allows considerably higher circuit densities.

Another object is to eliminate manual tweaking of designs and lower the expertise demanded from a designer.

Another object is to isolate a design from the applied silicon technologies by handling all future silicon process enhancements with one tool set.

Another object of the invention is to provide silicon architecture that facilitates fast and simple design tools to minimize learning and require no expertise in device architecture.

BRIEF DESCRIPTION OF THE INVENTION

The purpose of this invention is to better utilize the silicon surface area by using highly regular memory structure for logic applications instead of such cells as gates and flip-flops. Sequencers are logic processors that do not have jump, branch or similar instructions that change the order of instruction execution. This invention describes how a set of synchronized sequencers can be used for quick and efficient processing of system level designs.

First, a system level description in the form of schematics and VHDL, Verilog or other hardware description language files is converted into an equivalent set of Boolean logic equations. Next, these equations are mathematically optimized, converted into binary instruction code and distributed between sequencers according to an algorithm that simplifies communication between design sections located in different sequencers. For optimum utilization of silicon resources, approximately the same number of instructions is assigned to each sequencer.

Each sequencer uses an associated program memory for storing binary instructions executing the assigned logic equations and data memory for storing the results of logic equation processing. During device programming the associated program memory for each sequencer is loaded with its own set of machine instructions representing the associated logic equations. Since all sequencers and the associated program memories are driven preferably by a single common address register, they operate and execute logic equations synchronously with each other.

Because of the synchronous operation of sequencers, the compiler that distributes logic equations between them can calculate in advance at what time the result of each logic operation will be provided on the selected sequencer output. A compiler then arranges instructions in the interconnected neighboring sequencer so that it will be ready to read this output as it occurs without any additional control signals that are typically used to facilitate communication between processors. Alternatively, the compiler can insert into the interconnected neighboring sequencer an interrupt-like instruction that saves the data produced by a neighboring sequencer in its data memory and then resumes processing logic equations.

The design tools for development of digital circuit devices per my invention will be simple and operate at about two orders of magnitude faster than the tools for designing devices employing the current silicon architectures. Specifically, only the behavioral simulation of the design will be needed. Since the number of instructions in a program memory and the operating clock speed determine the sampling rate of the logic circuit located within a sequencer, there is no need for timing analysis. This sampling rate is the maximum response time of the sequencer to the external signals. By lowering the number of instructions in a sequencer and increasing its clock speed, this sampling rate can be increased accordingly.

Since the tools built per my invention are based on mathematical algorithms, they provide optimized allocation of design sections to silicon surface areas. As a result, there is less chance that some designs will have substandard performance or that manual tweaking of designs would improve silicon area utilization or device performance.

DETAILED DESCRIPTION OF THE PREFERRED EMBODIMENT

Figure 1:
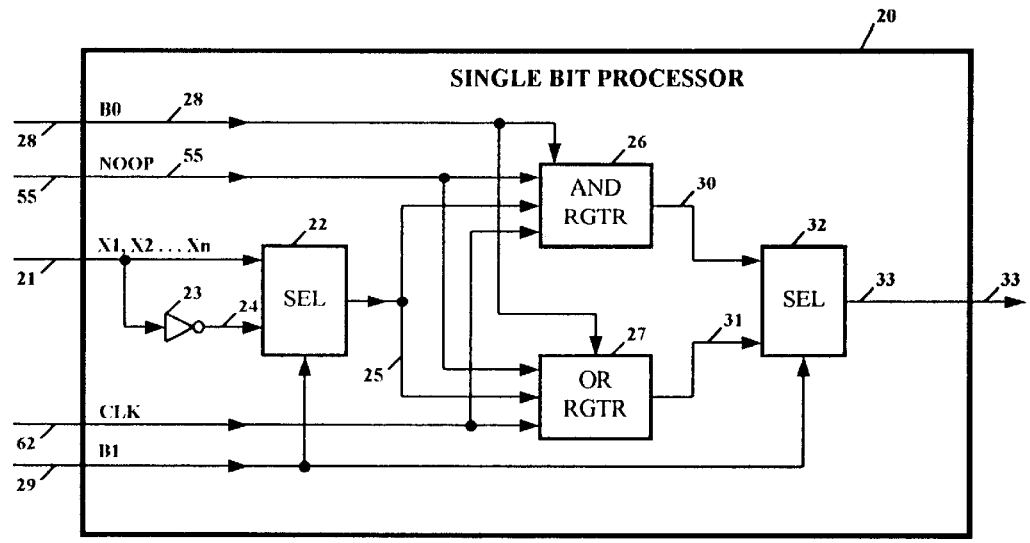
FIG. 1 is a diagram illustrating a single bit processor.

A single bit processor embodiment is illustrated in FIG. 1. This embodiment facilitates Reverse Polish Notation (RPN) machine instruction execution. Processor 20 is based on two (2) concurrent operations that are performed on all input variables in parallel. They are shown in FIG. 1 by way of an example as AND register 26 and OR register 27. Since processor 20 allows an inversion operation by means of inverter 23, the presence of both registers 26 and 27 is not mandatory to execute logic equations, because de Morgan theorem allows conversion of AND operations into OR operations and vice versa by using the inverter 23. It will be within the scope of the invention to replace either the AND register 26 or the OR register 27 by a block performing an XOR or other logic operation.

AND register 26 is set to logical one (1) at the beginning of each logic equation execution. The first zero (0) will reset the register 26 to zero (0) and will keep it at zero (0) independent of the following logic values. OR register 27 is set to logical zero (0) at the beginning of logic equation processing and will permanently be set to one (1) by the first logical one (1) that appears on its input. Both registers 26 and 27 are automatically set to their initial values one (1) and zero (0), respectively, at the start of each new logic equation execution as represented by the associated machine instructions.

Single bit processor 20 has input signal selector 22 for selecting either the true value of the input variable, provided on signal line 21, or its negation or inverse provided by the inverter 23 and associated signal line 24. Single bit processor 20 may be a single bit processor such as that disclosed and described in U.S. Pat. No. 4,101,967 issued Jul. 18, 1978 to the same inventor as the invention disclosed herein and incorporated herein by reference. Selectors 22 and 32 are under control of B1 bit of the instruction word, provided on signal line 29. Selector 32 selects under control of B1 bit either AND register 26 output via signal line 30 or OR register 27 output via signal line 31 and provides the selected data on signal line 33.

The B0 bit on line 28 controls single bit processor 20 operation mode; If B0=0, AND register 26 and OR register 27 are accepting input data and are performing in parallel the AND and OR logic operations. This instruction is called "the input instruction". If B0=1, then the data stored in registers 26 and 27 is outputted by selector 32 via signal line 33 to the device specified by bits B2–Bn of the instruction word. This instruction is called "the output instruction". The AND register 26 and OR register 27 are preset to one (1) and zero (0), respectively; either by the output instruction or the first input instruction that follows an output instruction.

The single bit processor 20 instruction set is listed in Table 1.

TABLE 1

Logic Operations Instructions.

| B0 | B1 | Boolean Operation | B2-Bn |
|----|----|-------------------|-------|
| 0 | 0 | TRUE input | (operand address) |
| 0 | 1 | NOT input | (operand address) |
| 1 | 0 | AND output | (operand address) |
| 1 | 1 | OR output | (operand address) |

$$F1=!X1*X2 \qquad (1)$$

The operation of processor 20 (FIG. 1) is explained with reference to logic equation (1), where ! means inversion or logical NOT of the variable following it. According to the RPN process, the processing starts with the first argument in equation (1) from the right and proceeds to the left. First, argument X2 will be fetched via signal line 21 and selector 22 and will be fed via signal line 25 for processing by AND register 26 and OR register 27.

Next, inversion of the X1 logical value will be provided by inverter 23 and fed into registers 26 and 27 via signal line 24, selector 22 and signal line 25. The last step in processing the F1 logic equation (1) is outputting AND register 26 value via signal line 30, selector 32 and signal line 33. Using instruction codes from Table 1, the following instructions are needed for execution of the F1 logic equation:

---
(A) IN X2 - fetch X2; binary: 00+X2 address
(B) IN Not X1 - fetch Not X1; binary: 01+X1 address
(C) OUT F1 - output AND result; binary: 10+F1 address
---

Nested logic equations with multiple parentheses are processed starting with the lowest level parentheses. For example, the logic equation F4=(((!X1*X2)+!X3+X4)*!X5)+X6 must be processed in four (4) steps: first calculate the value of F1=!X1*X2, as shown above. Next, calculate F2=F1+!X3+X4, F3=F2*!X5 and F4=F3+X6.

A sequencer is a processor that performs all operations in a strictly predefined order. For this reason it does not process such instructions as branch or jump. The art of sequencer design is well established. Specifically, sequencer 9 (FIG. 2) includes distributed program memory 10 for storing machine instructions for execution of logic equations, instruction decoder 13 for detecting instructions provided on the output of program memory 10, data memory 14 for storing outputs generated by single bit processor 20, and input multiplexer 42 and output register 46 for communication with the outside world. Output register 46 is a bit addressed register and data can be stored individually in each bit of register 46. The output register 46 is similar in operation to 74LS259, made by Texas Instruments.

The data provided from single bit processor 20 on signal line 33 can be used for direct communication with other sequencers.

Write controller 15 and input controller 19 are used for storing data in data memory 14 and output register 46. They can be considered as part of instruction decoder 13 but for greater clarity have been shown explicitly.

Figure 2:
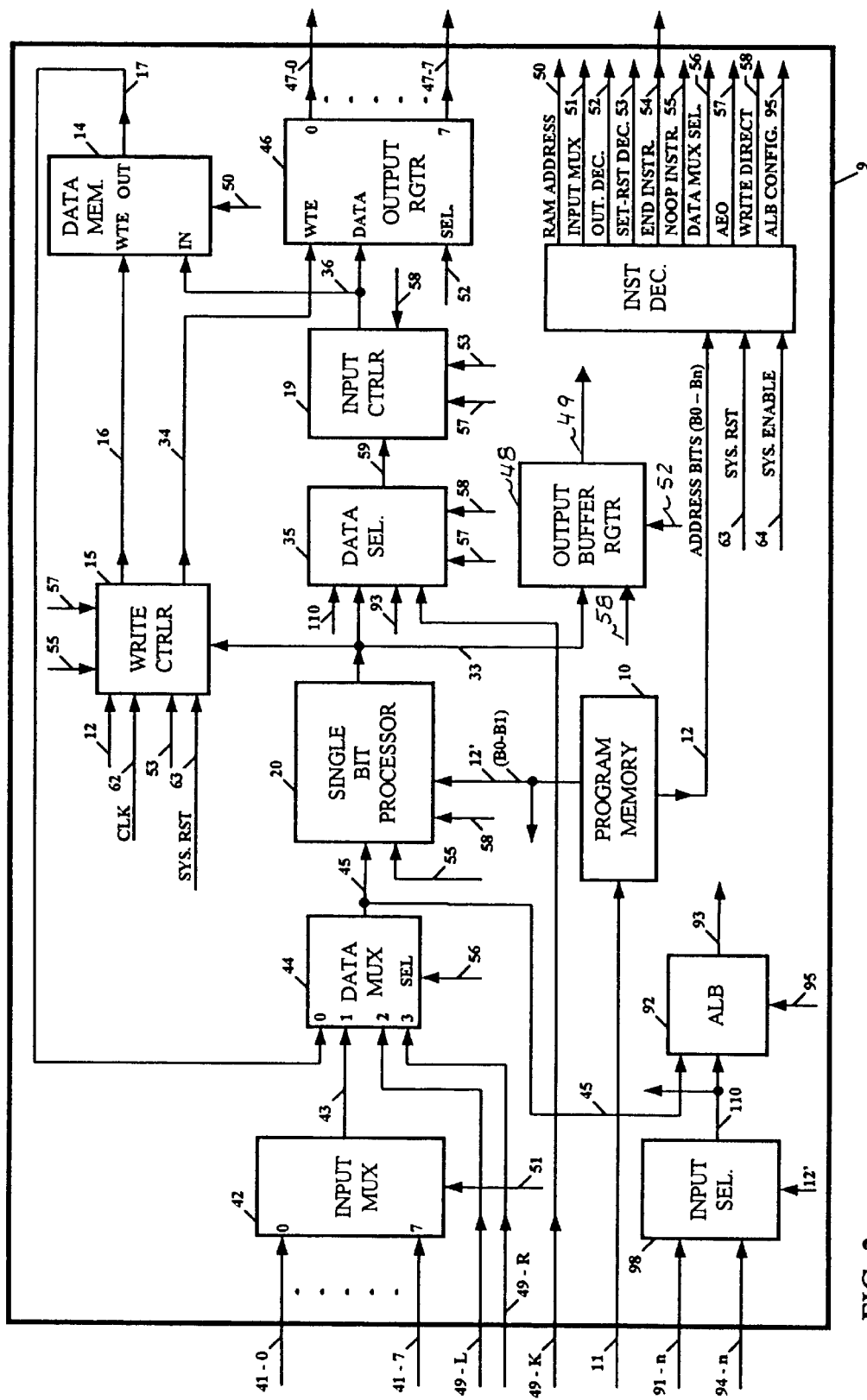
FIG. 2 shows a sequencer embodiment.

Program memory 10 in FIG. 2 is distributed program memory and operates under control of address lines 11 producing instruction words on signal lines 12 and 12'. Signal line 12 carries bits B0 through Bn, which are used by instruction decoder 13 for decoding operand addresses and special instructions, such as NOOP or "no operation", END of working program and others, listed in Table 3. Signal line 12' carries only bits B0 and B1 which are the primary bits that control the operation of single bit logic processor 20.

Figure 8:
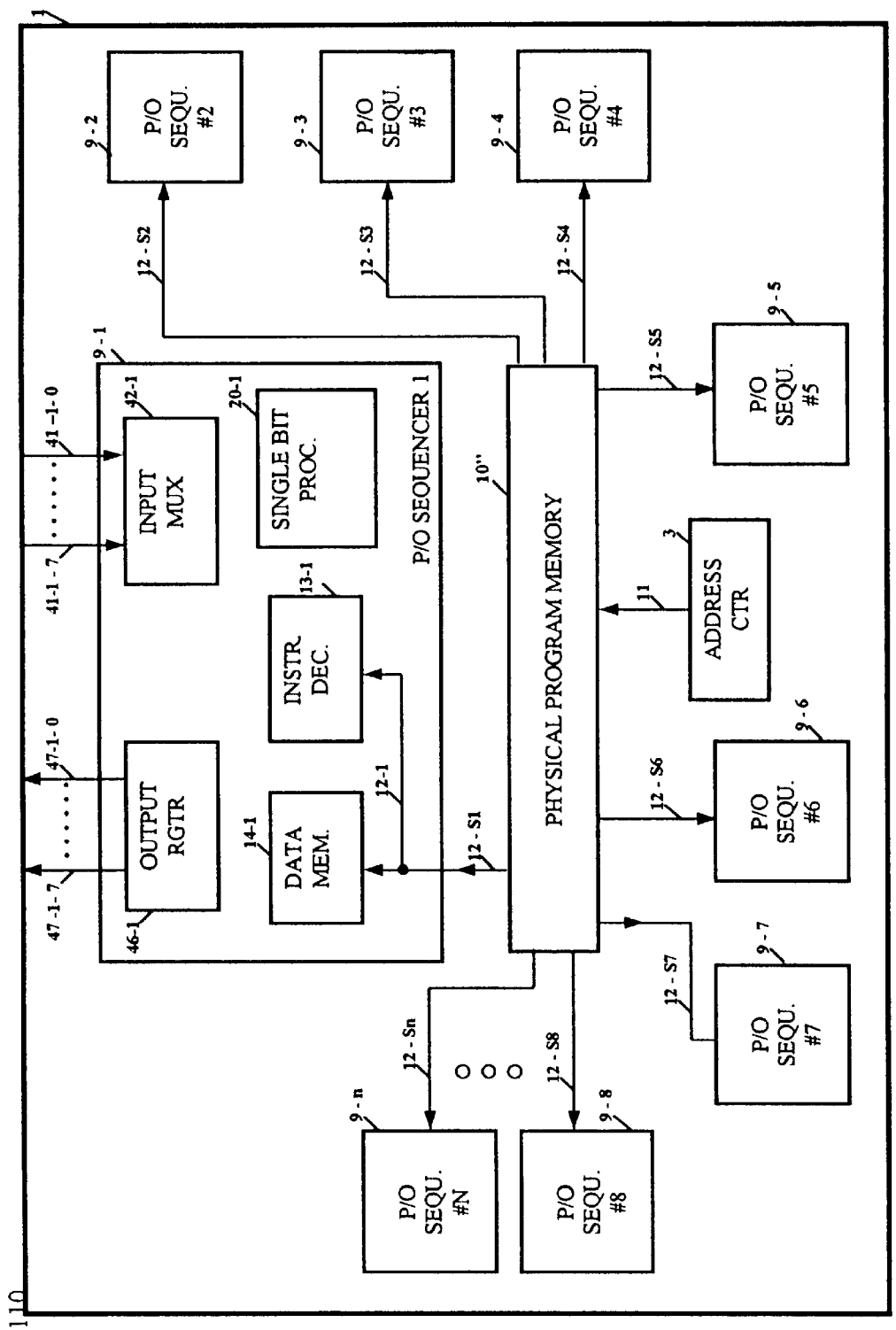
FIG. 8 illustrates implementation of hardware embodiments.

Since program memories 10 of sequencers 9-1 through 9-n are identical and are addressed by the same address counter 3, they can be combined into one common physical program memory 10", located preferably in the center of the device 1, as shown in FIG. 8. The physical placement of items within a sequencer is shown by the way of an example in reference to Sequencer 9-1 in FIG. 8.

Common program memory 10" output is divided into separate instruction words provided on signal line 12-S1 through 12-Sn. The address counter 3 is located in close proximity to the common program memory 10" and addresses its outputs via signals on signal line 11.

Since instruction decoders 13 and data memories 14 of sequencers 9-1 through 9-n are generally addressed directly by the output bits of the associated common program memory 10", it is preferred that instruction decoder 13 and data memory 14 are located in close proximity to common program memory 10", producing signals on the corresponding signal lines 12-S1 through 12-Sn.

The physical layout of the device 1 in FIG. 8 implies that the input multiplexers 42-1 through 42-n and output registers 46-1 through 46-n are preferably located at the periphery of the device 1 and close to its input/output connecting pins.

Input multiplexer 42, which can be a model 74LS251 manufactured by Texas Instruments or similar device, is used for feeding external data into the processor 20. In practical application, multiplexers 42 and 44 are preferably-.combined into a single multiplexer. Data multiplexer 44 is shown only to demonstrate explicitly how processor 20 input is switched between data memory 14 output, input multiplexer 42 data and data from neighboring sequencers, provided on signal lines 49-L and 49-R.

Single bit processor 20 output data is fed into output buffer 48 via signal line 33. Output buffer 48 is clocked by signal on signal line 58 under control of B0=1. This means that each time sequencer 9 executes a store operation, output buffer 48 is loaded with new data, and as long as sequencer 9 executes read instructions, output buffer 48 data remains unchanged. The data from output buffer 48 is output on signal line 49-L and may be used by neighboring sequencers 9-2 through 9-n, shown in FIG. 3, to exchange data. The output buffer 48 is needed primarily for data transfer over signal lines 49-L and 49-R that are connected to the input multiplexers 42 of sequencers 9-1 through 9-n. The signal line 49-K that is connected directly to the data selector 35 of the neighboring sequencers 9-1 through 9-n can be connected directly to signal line 33, eliminating a need for output buffer 48. It is within the scope of the invention that the signal lines 49-L, 49-R and 49-K are connected from each sequencer 9 to 4,6 or other number of its neighboring sequencers 9-1 through 9-n, forming a matrix connection between sequencers.

The output data from neighboring sequencers, provided on signal lines 49-K, can be loaded directly into output buffer register 48 under control of signal line 58 and into data memory 14 via selector 35, signal line 59, input controller 19 and signal line 36. Selector 35 is under control of signal line 58 generated by decoder 13 in response to program memory 10 output specifying such transfer. There are many ways to accommodate such transfer. For example, the lower "m" bits of data memory 14 can be dedicated to transfer of data from neighboring sequencers. And any time a store operation addresses this section of data memory 14, the data on signal lines 49-K is automatically read into the data memory 14. The signal line 49-K represents multiple signal lines such as 49-1, 49-2, etc. which are provided by output buffer register 48 of the neighboring sequencers.

Preferably logic sequencer 9 uses the input/output (I/O) memory mapping technique. Using this technique, bits B2 through Bn address a space that is divided between the input multiplexers 42 and 44, output register 46 and data memory 14 data. For example, if the address part of the instruction word on signal line 12 is 10 bits wide, it can address a total of 1024 locations, e.g. from 0 up to 1023. If the upper-most 16 bits from 1008 up to 1023 are assigned to input multiplexer 42, then decoder 13 will produce on signal line 51 an enabling signal for multiplexer 42 any time one of these sixteen addresses is detected. Similarly, if the eight bits from 1016 up to 1023 have been assigned to output register 46, and a store operation to output register 46 has been detected by instruction decoder 13, then the appropriate bit within output register 46 will be selected via signal lines 52 and the data provided on signal line 36 will be stored under control of the write signal provided on signal line 34. Table 2 provides an example of a sequencer having 16 bit input multiplexer and 12 output decoder.

Instruction decoder 13 produces RAM (random address memory) address signals on signal line 50 that are enabling the internal data memory 14 to store single bit processor 20 outputs at designated locations. In case of aforementioned I/O memory mapped addressing scheme, the address section of the instruction word could be directly applied to the data memory 14.

If the input multiplexers 42 and 44 and output register 46 are "modulo 2", having either 2, 4, 8, 16 or 32 inputs or outputs, then the appropriate low order address lines of signal line 12 could be directly connected to multiplexers 42 and 44 and output register 46 via signal lines 51, 56 and 52, respectively. The actual writing of data into data memory 14 and output register 46 is performed under control of data write controller 15 which decodes the Table 2 instructions and controls writing of data into data memory 14 and output register 46 via signal lines 16 and 34, respectively.

TABLE 2

Operation and Address Decoding

| B0, B1 | B2- B(n-4) | B(n-3) | B(n-2)-Bn | Instruction |
|---|---|---|---|---|
| 0, 0/1 | Not all 111 11 | x | x,x,x | Input; RAM operand address |
| 0, 0/1 | All are 111 11 | x | x,x,x | Input; MUX operand address (16) |
| 1, 0/1 | Not all 111 11 | x | x,x,x | Output; RAM operand address, output |
| 1, 0/1 | All are 111 11 | 0 | x,x,x | Output; DEC operand address (8) |
| 1, 1 | All are 111 11 | 1 | 0,x,x | Output; DEC operand address (4) |
| 1, 1 | All are 111 11 | 1 | 1,x,x | Special instructions (see Table 3) |

Legend
1—logical 1
0—logical 0
0/1—can be logical 0 or 1
x—the address bit
MUX—input multiplexer
DEC—output decoder
RAM—designates data memory Write controller 15 controls writing of data into data memory 14 and output register 46. Instruction decoder 13 decodes addresses for input multiplexers 42 and 44, data memory 14 and output register 46. If instruction decoder 13 detects a no-operation instruction (NOOP), it halts processor 20 operation and disables write controller 15 by means of signal line 55. When instruction decoder 13 detects an end-of-program or END instruction, it activates reset controller 5-1 in FIG. 3, via signal line 54-1. Reset controller 5-1, resets address counter 3 via signal line 66, forcing it to start counting from zero (0). As an alternative, reset controller 5-1 can preset address counter 3 to a predetermined count, being the beginning of program execution. The special instructions decoded by instruction decoder 13 are listed in Table 3. Instruction decoder 13, write controller 15 and input controller 19 can be combined into a single instruction decoder if desired.

TABLE 3

Special Instructions Decoder

| B0 - B(n-3) | B(n-2) | B(n-1) | Bn | Name | Description |
|---|---|---|---|---|---|
| 11111 ... 1111 | 1 | 1 | 1 | NOOP | no operation |
| 11111 ... 1111 | 1 | 1 | 0 | END | end of program |
| 11111 ... 1111 | 1 | 0 | 1 | S/R | S/R operations |
| 11111 ... 1111 | 1 | 0 | 0 | AEO | AE operations |

An asynchronous flip-flop can be modeled using the Table 1 instructions, as shown in equation (2) as follows:

$$Qn = Set + !Reset * Q(n-1) \qquad (2)$$

However, equation (2) requires six machine instructions to calculate Qn. In addition, the variable Q(n−1) must also be stored in data memory 14, which requires two additional instructions. The asynchronous flip-flops can be modeled much more effectively by changing single bit processor 20 operation when a special asynchronous S/R (Set/Reset) instruction is detected. The S/R instruction allows modeling of asynchronous flip-flops in data memory 14 and output register 46 with minimum machine instructions and without keeping a copy of output register 46 data in data memory 14.

When sequencer 9 is operating according to Tables 1 and 2, single bit processor 20 output data is fed via signal line 33 to selector 35, and then passed via signal line 59, input controller 19 and signal line 36 to data memory 14 and output register 46. Similarly, when sequencer 9 is operating according to Tables 1 and 2, write controller 15 produces a write pulse on signal line 16 connected to data memory 14 and signal line 34 connected to output register 46. Each time B0=1, except for special instructions in Table 3, a write pulse is produced by controller 15 to store single bit processor 20 output data into data memory 14 and output register 46.

If the S/R instruction listed in Table 3 is detected by instruction decoder 13, it sends S/R signal via signal line 53 to the write controller 15, and input controller 19 and permanently inhibits storing of data provided on signal line 33 in memory 14 and output register 46. Write controller 15 will issue a write pulse on signal lines 16 and 34 only when AND register 26 output is one (1). Input controller 19 will operate according to Table 4 and will produce one (1) on signal line 36 for the SET instruction and zero (0) for the RESET instruction. This data will be stored in data memory 14 and output register 46 under control of the write pulse produced by controller 15. For example, if B0=1 and B1=0, indicating a SET instruction, then one (1) on AND register 26 output will activate the set operation, which will write logical one (1) at the specified location in memory 14 or output register 46. However, if the AND register 26 output is zero (0) then no write pulse will be issued by write controller 15 and the specified memory 14 or output register 46 location will remain unchanged. The RESET instruction from Table 4 operates similarly. However, it writes zero (0) into the specified location in memory 14 or output register 46 location if the AND register 26 output is one (1). If the AND register 26 output is zero (0) then no write pulse will be generated and no reset will take place. The AND register 26 was used here as an example. In its place OR register 27 (FIG. 1) could be used.

TABLE 4

List of S/R Instructions.

| B0 | B1 | S/R Operation | B2-Bn |
| --- | --- | --- | --- |
| 0 | 0 | TRUE input | (operand address) |
| 0 | 1 | NOT input | (operand address) |
| 1 | 0 | SET instruction | (operand address) |
| 1 | 1 | RESET instruction | (operand address) |

The S/R (Set/Reset) instruction from Table 4 sets sequencer 9 into the S/R mode and permanently alters its operation. From now on the sequencer 9 will operate as per Table 4, and for this reason, the S/R instruction should be preferably placed after the Boolean-related machine instructions, controlled by Tables 1 and 2. The S/R mode can be terminated by the END instruction, hardware system reset signal on line 63, or toggled on/off by another S/R instruction.

Figure 7:
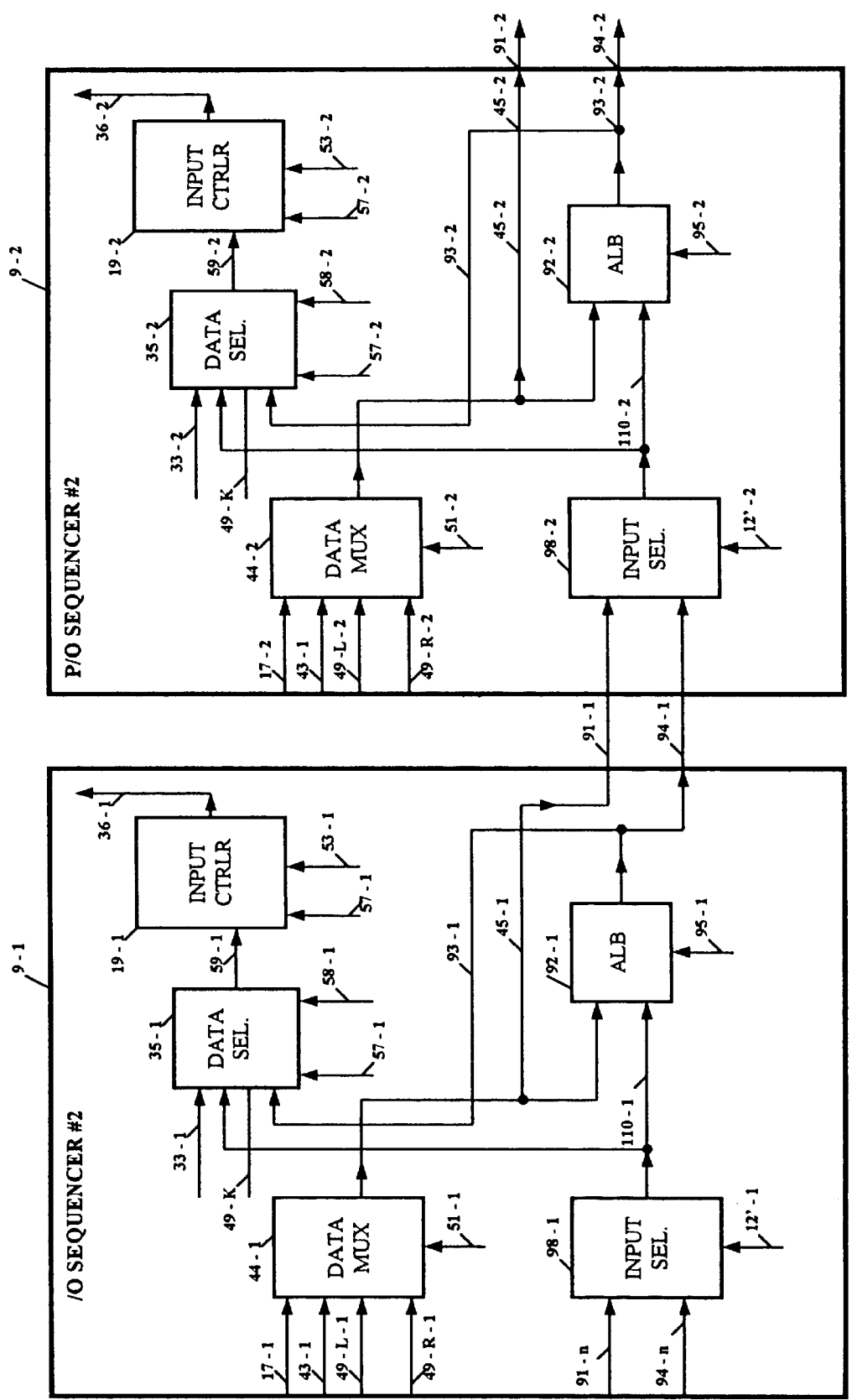
FIG. 7 is a diagram illustrating a hardware embodiment for arithmetic operations.

Logic devices are increasingly used in various communications devices where encoding and decoding of information with the use of XOR and other operations is commonplace. Also, some basic arithmetic operations are used in information processing. To speed arithmetic and encoding operations, input selector 98-1 and arithmetic logic block (ALB) 92-1 have been added to sequencer 9-1, as shown in FIG. 7.

When the Arithmetic and Encoding Operations (AEO) instruction listed in Table 3 is detected by instruction decoder 13, it changes sequencer 9 operation by modifying write controller 15, and input controller 19 operations via signal line 57. When sequencer 9-1 enters the AEO mode, instruction decoder 13 issues an AEO signal on signal line 57 that modifies the operation of controllers 15 and 19, forcing them to perform operations listed in Table 5. The very first instruction after the AEO instruction provides hardware configuration data for the arithmetic-logic block 92-1. This configuration is decoded by instruction decoder 13 and is fed via signal lines 95-1 to ALB module 92-1. The data on signal line 95-1 may configure ALB block 92-1 as either XOR logic gate, XNOR, half adder or full adder. Selection of other logic or arithmetic blocks is within the scope of this invention. The instructions that follow ALB block 92-1 configuration instruction perform the desired arithmetic, logic or encoding operations. It is within the scope of this invention to use other methods of ALB configurations, such as permanent configuration of ALB into a full adder or XOR element. Another option is to use the code reserved for S/R operations as ALB configuration instruction. Each sequencer from 9-1 to 9-n can be set to its own operational mode independently of other sequencers in the same device or interconnected devices. To exit the AEO mode and return back to the basic logic operations mode, the program may issue another AEO instruction that will toggle sequencer 9-1 back to the logic operations mode depicted in Tables 1 and 2.

TABLE 5

The Arithmetic and Encoding Operations.

| B0 | B1 | B2-Bn | Operation |
| --- | --- | --- | --- |
| 0 | 0 | Address | Combine channel A + w/internal data |
| 0 | 1 | Address | Combine channel B + w/internal data |
| 1 | 0 | Address | Store ALB output in local RAM |
| 1 | 1 | Address | Store channel B in local RAM |

The term "internal data" in Table 5 means data provided on signal line 45-1 by the associated multiplexer 44-1; "Combine" means performing the arithmetic or logic operation specified by the ALB arithmetic-logic block 92-1. "Channel A" designates data provided on signal line 91-n, and "channel B" designates data provided on signal line 94-n.

FIG. 7. depicts arrangement of two sequencers 9-1 and 9-2 in the arithmetic and encoding configuration. For better clarity, only the necessary blocks and signals from FIG. 2 have been shown to explain the operation of this configuration. It should be remembered that other blocks such as instruction decoder 13 and various signals listed in FIG. 2 are also used for this configuration. The signal lines and blocks within sequencers 9-1 and 9-2 have been appended with the sequencer's number. For example, data multiplexer in sequencer 9-1 is called 44-1 and data memory 14 in sequencer 9-2 is called 44-2. A similar naming convention has been used in reference to all signal lines throughout. All blocks and signals shown in FIG. 2 are appended with the sequencer number when discussing them in reference to FIGS. 3 and 7. To avoid confusion when signal lines cross between sequencers, the output signal lines connecting sequencers 9-1 and 9-2 have been assigned new numbers to maintain the original signal line numbering within the sequencer 9-1. For example, signal line 45-1 is called 91-1 outside the sequencer 9-1.

As per Table 5, the B0=0 and B1=0 condition selects data on signal line 91-n to the output of input selector 98-1, which is connected through signal line 110-1 to block 92-1. Instruction decoder 13 issues a signal on signal line 95-1 that forces block 92-1 to perform an operation on data provided on external signal line 91-n and internal signal line 45-1. This way, block 92-1 can perform an arithmetic or logic operation on data stored in different sequencers such as 9-1 and 9-n. To further explain the operation of the ALB block 92-1, let assume that it has been set to XOR configuration, and the data on signal line 91-n is one (1), data on signal line 94-n is zero (0) and internal data on signal line 45-1 is one (1). From Table 5 we derive that for B0=0 and B1=0, the output on signal line 93-1 will be zero (0). However, for B0=0 and B1=1, block 92-1 output, as provided on signal line 93-1 will be one (1).

The signal generated by the ALB block on signal line 93-1 is fed into data selector 35-1, which is under control of the AEO signal line 57-1. If B0=1 and B1=0, then the signal on signal line 93-1 is stored in local memory 14-1 under control of signal 57-1 that controls selector 35-1 and controller 15-1 operations. The data is stored at the address specified by bits B2–Bn. If B0=1 and B1=1, then signal line 12'-1 selects on signal line 110-1 the data provided on signal line 94-n. Signal line 57-1 controls loading of data present on signal line 110-1 through selector 35-1, signal line 59-1, controller 19-1 and signal line 36-1 into data memory 14-1.

Selecting a 1-bit full adder in block 92-1 will facilitate arithmetic operations. If B0=0 and B1=0, then an "add" operation will be performed on sequencer 9-1 data provided on signal line 45-1 and data supplied by another sequencer on signal line 91-n. The result of this "add" operation will be stored by block 92-1 for one clock cycle and provided on signal line 93-1. Data on signal line 93-1 can be used by the next instruction within the sequencer 9-1, or it can be used in the next clock cycle by the adjacent sequencer 9-2. There may be numerous modifications to the operations listed in Table 5, however, they all fall within the scope of this invention.

Figure 3:
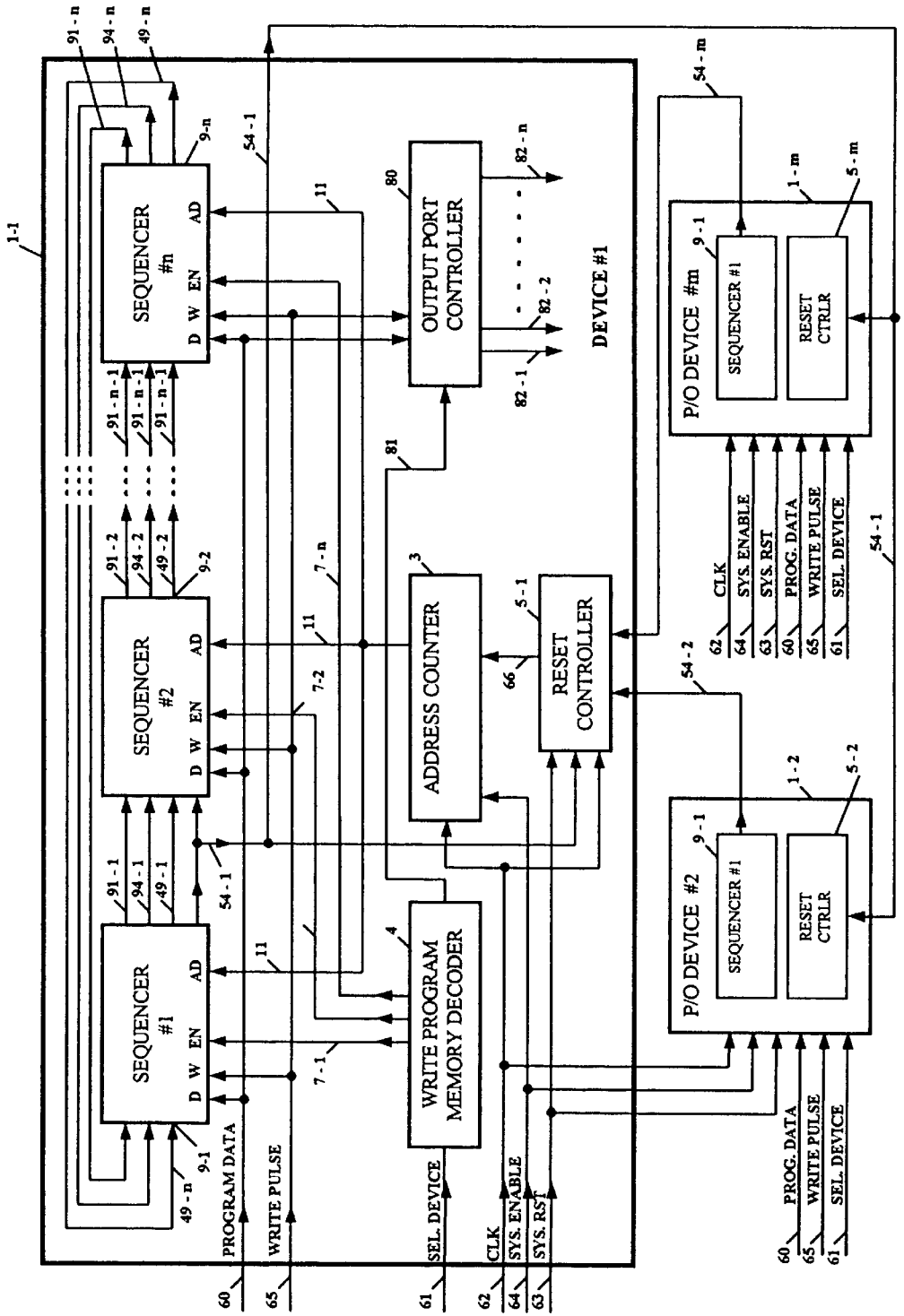
FIG. 3 illustrates sequencer connections within a device.

System level designs described by VHDL, Verilog, EDIF netlist and similar files may be converted into a file or files with thousands of logic equations. Since processing of such large number of equations by a single sequencer would take a long time, FIG. 3 shows an arrangement of multiple sequencers 9-1 through 9-n that share processing of logic equations. Sequencers 9-1 through 9-n, are being driven by such common blocks as address counter 3, write program memory decoder 4, output port controller 80 and reset decoder 5-1. Address counter 3 is incrementing its value under control of system clock 62 and addresses consecutive locations in program memory 10 of sequencers 9-1 through 9-n by means of address signal lines 11. Reset controller 5-1 resets counter 3 by issuing a signal on signal line 66. Reset controller 5-1 issues a reset command any time it senses a system reset condition on signal line 63, END signal on signal line 54-1 or external device reset condition on signal lines 54-2 and 54-m, should any of these devices become the system level reset device. The system level reset device is the device that has been programmed with the END instruction for the entire set of devices 1-1 through 1-m. The reset operation is typically performed before loading program memory 10 and before the start of the first operational cycle of device #1.

The device #1 operation is enabled by the System Enable signal provided on line 64, which allows counting by counter 3. The signal on signal line 64 allows stopping execution of instructions at any point and may be used for device #1 diagnostics.

When the last instruction in the program memory 10 (FIG. 2) has been executed, sequencer 9 should begin addressing memory 10 starting from the address 0. This requires resetting counter 3. Typically, software subroutine 122 (FIG. 6) places the END instruction as the last executable instruction in a pre-selected sequencer, e.g. sequencer 9-1. The END instruction is detected by instruction decoder 13, which provides END signal on signal line 54-1, activating reset controller 5-1 and terminating program execution by sequencers 9-1 though 9-n in device #1. Signal line 54-1 is also connected to an outside pin to allow synchronization of device 1-1 with other devices such as 1-2 and 1-m, involved in processing of the associated logic equations.

If the number of logic equations is so large that they do not fit into a single device #1, additional devices such as devices #2 through #m may be connected together for increased logic equation processing power. As shown in FIG. 3, all devices 1-1,1-2 and 1-m share the same clock signal provided on signal line 62, system reset provided on signal line 63 and system enable provided on signal line 64. In addition, reset controllers 5-2 through 5-m of devices 1-2 through 1-m are connected to the END signal line 54-1, performing the function of the system master reset.

Each sequencer in FIG. 3 can interact with its neighboring sequencers to process or exchange data. For example, sequencer 9-1 can directly operate on data provided by sequencers 9-2 and 9-n on signal lines 49-R and 49-L, respectively, which may represent two or more neighboring sequencers. In addition, each sequencer can directly save in data memory 14, data provided by other sequencers on signal lines 49-K. Signal lines 49-K facilitate quick data transfer between sequencers and may include for example signal lines 49-L, 49-R, 91-n and 94-n.

Figure 4:
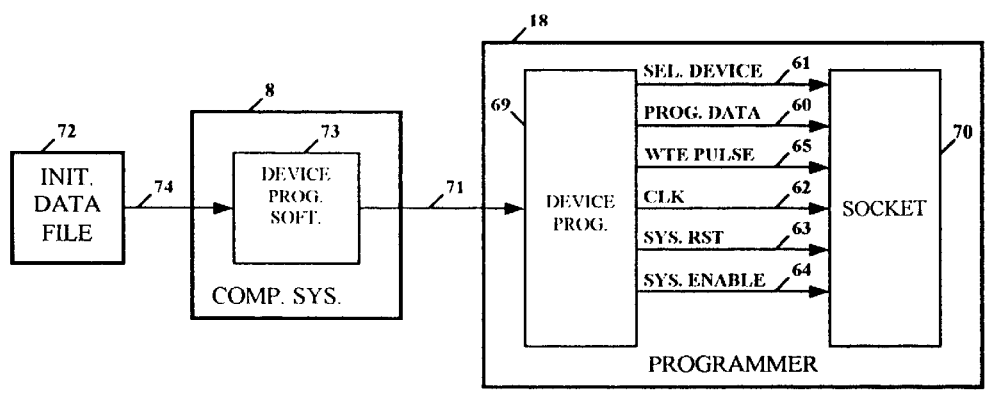
FIG. 4 illustrates a device programming diagram.

Programming of device #1 is shown in FIG. 4. Programmer 18 has a device programmer 69 and a socket 70 for inserting device #1 to be programmed. Computer system 8, which can be any personal computer such as Pentium or similar, controls the device programmer 69 via signal lines 71. Device programmer 69 is similar to PLD and FPGA programmers from such companies as Virtual Computer Corporation, Reseda, California and Data I/O Corporation, Redmond, Washington. Device #1 programming is accomplished via a set of signals provided by device programmer 69 and sent to socket 70 on signal lines 60 through 65. These signals are fed into device #1 via socket 70 interconnecting pins. If device #1 is programmed in-circuit, then the role of socket 70 may be performed by the solder or grid ball connections between device #1 and the printed circuit board.

The device programming process is controlled by device programming software 73, residing within computer system 8 and generating appropriate signals on signal lines 71 that controls device programmer 69. The device programmer 69 generates signals provided on signal lines 60 through 65 for programming device 1 inserted in socket 70. First, device programmer 69 issues the system reset on signal line 63. This operation resets address counter 3 to "000". Next, the first instruction word to be programmed into the sequencer 9-1 is provided on signal lines 60. To load data from the signal line 60 into the program memory 10 of the sequencer 9-1, device programmer 69 issues the select device signal which is the sequencer address on signal line 61. That address is detected by write program memory decoder 4 (FIG. 3) that selects and enables sequencer 9-1 for loading with data. Data on signal line 60 is loaded into program memory 10 of sequencer 9-1, under control of the write pulse on signal line 65, which is issued by device programmer 69.

Following loading of data into sequencer 9-1, device programmer 69 provides data on signal line 60 to be loaded into program memory 10 of sequencer 9-2, and issues sequencer 9-2 address on signal line 61. Following this, programmer 69 produces a write pulse on signal line 65, which stores the data on signal lines 60 at location "000" in sequencer 9-2. After the last sequencer 9-n has been loaded with data at location "000", device programmer 69 issues a clock signal on signal line 62 and the address counter 3 advances to "001". Device programmer 69 issues data on line 60 for sequencer 9-1, followed by device address on signal line 61 and write pulse on signal line 65. Data from signal line 60 will be stored within sequencer 9-1 at the memory location "001". This process continues until all data is loaded into sequencers 9-1 through 9-n.

Since program memories 10-1 through 10-n of sequencers 9-1 through 9-n, respectively, are addressed by the same program counter 3, they should preferably be combined and made as one common memory 10". Each sequencer 9-1 through 9-n would then use different associated sections of one common memory 10".

Figure 5:
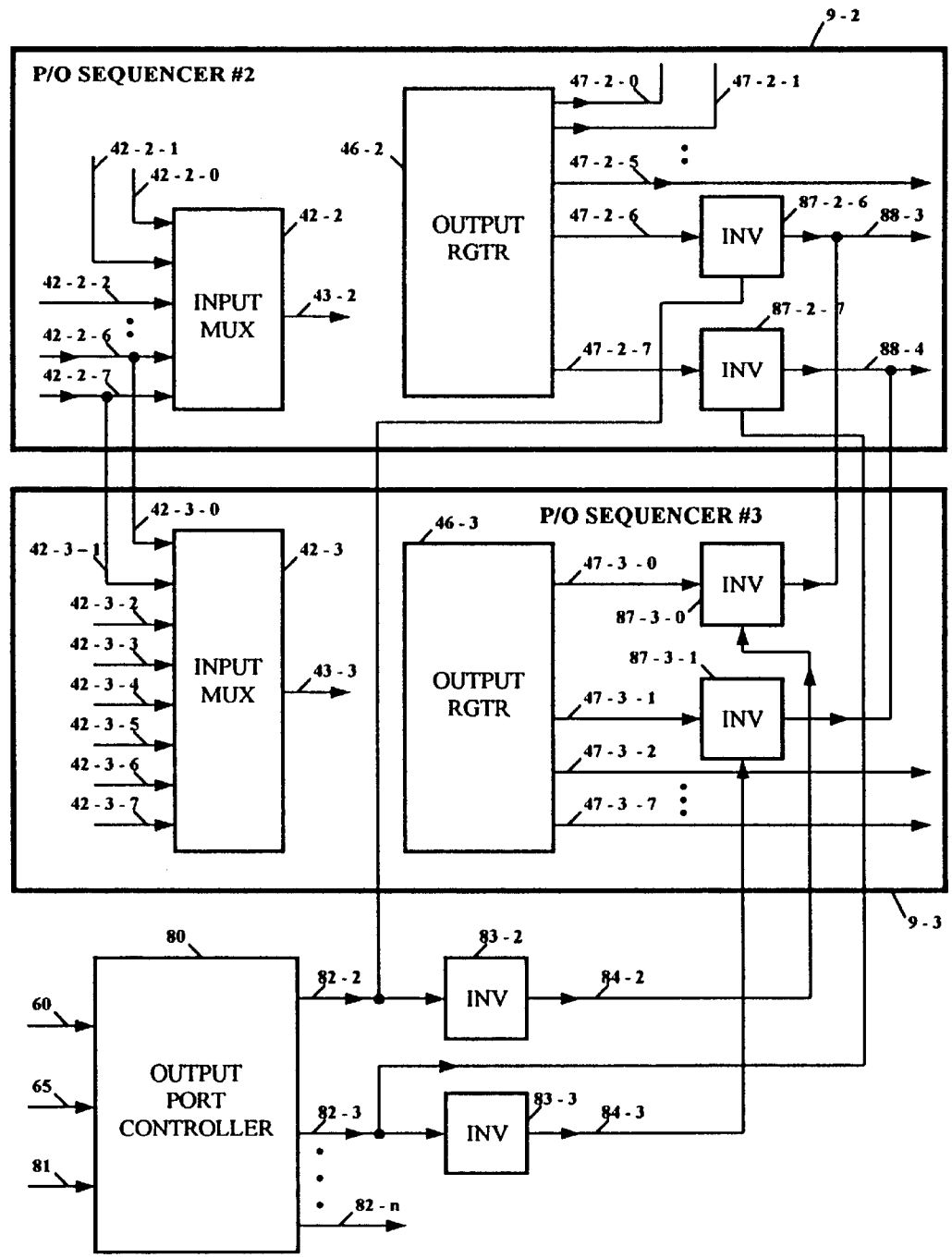
FIG. 5 illustrates an input/output (I/O) controller diagram.

Efficient assignment of device I/O pins is crucial for effective utilization of device resources. FIG. 5. shows a sample of the preferred I/O pin arrangement. To provide for effective use of input pins, input multiplexers 42-2 and 42-3 have only some of the input pins, such as 42-2-2, permanently assigned to the multiplexer 42-2. However, such pins as 42-2-0, 42-2-1, 42-2-6 and 42-2-7 can be shared with neighboring sequencers 42-1 and 42-3. Input signals that are used by both sequencers 9-2 and 9-3 should be assigned to the common pins 42-2-6 and 42-2-7.

It is preferred that the pin sharing scheme be employed to the output pins of registers such as 46-2, 42-3 and others. One example of such a scheme has been shown in FIG. 5. Register outputs 47-2-6, 47-2-7, 47-3-0 and 47-3-1 are tri-stated via associated drivers 87-2-6, 87-2-7, 87-3-0 and 87-3-1, and only one pin per pair of drivers is assigned for connection with external circuits. To prevent drivers with connected outputs from logic level conflict, only one of the drivers is enabled at any one time. This is accomplished by enabling the connected drivers, e.g. 87-2-6 and 87-3-0, with the opposite signals derived from the same signal source.

For example, port controller 80 enables via signal line 82-2 driver 87-2-6. The signal on signal line 82-2 is inverted by inverter 83-2 and fed on signal line 84-2 directly into the enable pin of driver 87-3-0 which output is connected with driver 87-2-6 output.

The output port controller 80 is a register that is loaded prior to logic equation execution in a manner similar to loading program memory 10 of sequencer 9-1. Write program decoder 4 (FIG. 3) enables output port controller register 80 load operation via signal line 81. A write pulse provided by device programmer 69 on signal line 60 loads data into register 80 provided by device programmer 69 on signal line 65.

The output signal lines 47-2-0 through 47-3-7 may also be connected to the device #1 pins by means of programmable fuses. It is understood that sequencers #1 and #n (not shown) having respective imputs and outputs 47-1-0 and 47-n-7 are implied. Such a solution is employed by current FPGA and CPLD technologies and falls within the scope of this invention.

Figure 6:
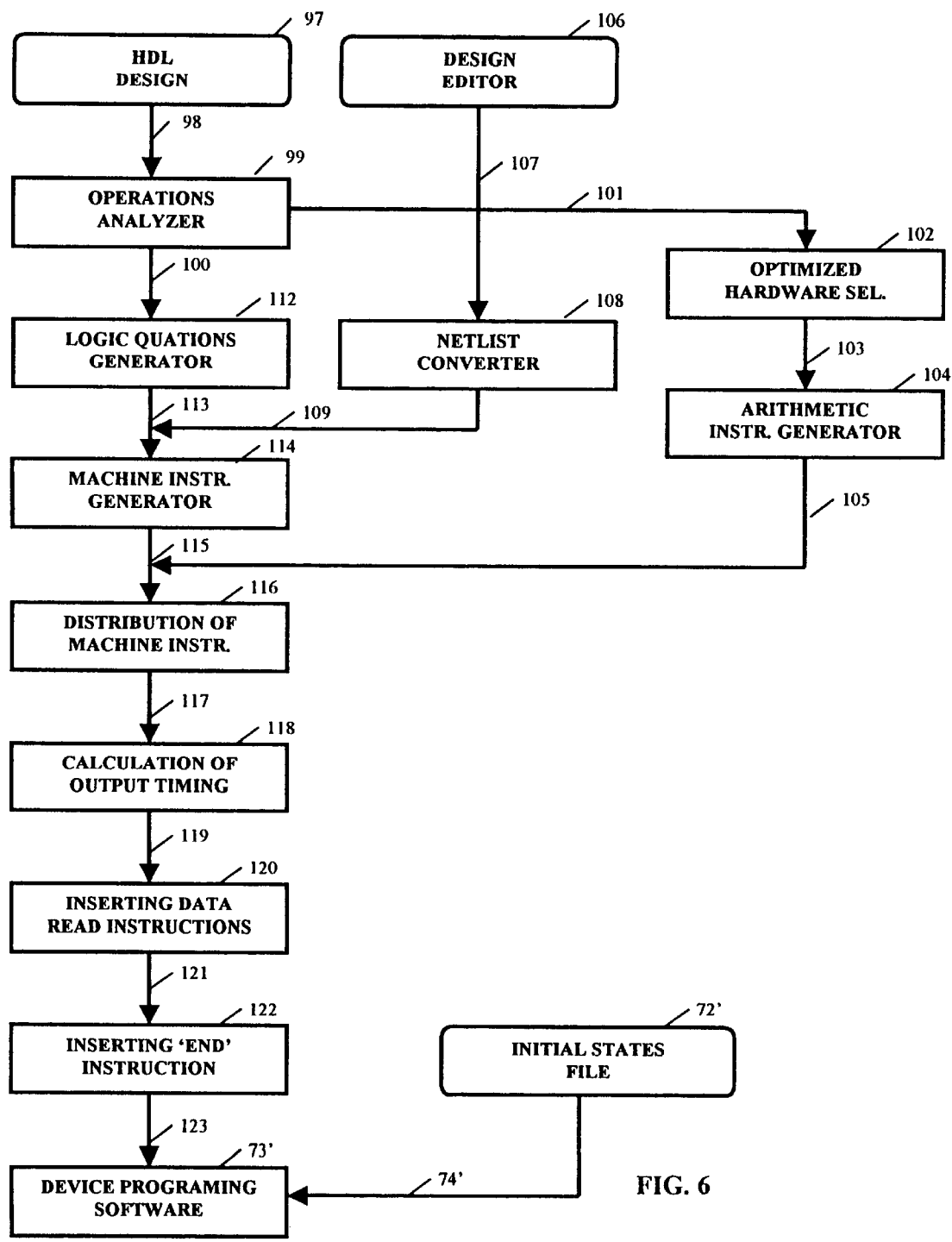
FIG. 6 is a flowchart of a logic processor compiler according to the invention.

Device 1 architecture has been designed to simplify software compilations. The software subroutines for processing designs and loading them into device 1 are shown in FIG. 6. The HDL design block 97 represents Hardware Description Language editors and language converters that produce hardware description language files, such as VHDL, Verilog, Superlog, SystemC, SpecC, C, Java, or similar. These files are fed via signal line 98 into the Arithmetic-Logic operations analyzer 99, which separates logic-oriented constructs from arithmetic constructs. The logic constructs are sent via signal line 100 to subroutine 112 that generates logic equations. The arithmetic constructs are sent via signal line 101 into the optimized arithmetic hardware select subroutine 102, which generates a set of instructions according to Tables 3 and 5 for on-line reconfiguration of sequencers 9-1 through 9-n for optimum arithmetic operations.

Subroutine 102 provides information on signal line 103 about the required arithmetic operations and selected hardware configuration. Arithmetic instruction generator subroutine 104 responds to data on signal line 103 and generates on signal line 105 a set of machine language instructions for sequencers 9-1 though 9-n for execution of the required arithmetic operations.

The Boolean equations generated by subroutine 112 are provided on signal line 113 into a software subroutine 114 that orders all equations in proper sequence, optimizes the expressions and converts them into machine language of sequencer 9.

Design editor 106 represents schematic editor, block diagram editor and logic synthesis tools which produce design netlists. Typically such a netlist will be given in the EDIF format and fed on signal line 107 into netlist converter 108 that converts the provided netlist directly into Boolean equations. The art of converting netlists into Boolean equations is well known and a number of software packages such as SUSIE simulator by ALDEC INC., Henderson, Nev. is capable of converting netlists into Boolean equations. Logic equations generated by subroutine 108 are fed on signal line 109 into software subroutine 114 that was described earlier. Software subroutine 114 provides instructions on signal line 115 in machine language code for software subroutine 116 that divides the instructions between sequencers 9-1 through 9-n. It is within the scope of the invention that subroutine 116 divides machine code related to the same logic equation or arithmetic operations into modules executed by different sequencers or executed by the same sequencer but at different time periods. Since logic equations can be translated one-for-one into assembly language, it is within the scope of the invention to divide the logic equations between sequencers and then convert them into machine instructions.

Software subroutine 118 reads machine instructions on signal line 117 and calculates at what time the selected results of logic equations or output data will be available on the outputs of sequencers 9-1 through 9-n and can be read by a neighboring sequencer. Data read instructions subroutine 120 reads data on signal line 119 and inserts appropriate read instructions into the receiving sequencer program to facilitate data transfer between sequencers. When a timing mismatch is difficult to eliminate, no-operation or NOOP instructions may be inserted to extend the duration of the sequencers' 9-1 through 9-n outputs. At times, the results of logic equation processing may be stored at the local data memory 14 and then output at an appropriate time to facilitate a match with the timing of the neighboring sequencer. Such an operation is called the local saving instruction and is one of the most effective ways to match the timing of neighboring sequencers outputs. The software subroutine 120 has a selectable option that generates code for direct transfer of data between sequencers 9-1 through 9-n via signal line 49-K. If such an option is active, the subroutine 120 inserts "instant read" instructions in the neighboring sequencers when a data transfer operation from another sequencer is needed. These "instant read" instructions halt processor 20 operation within the receiving sequencer and cause a direct write into data memory 14 of the data provided on signal line 49-K. The instant read instruction is detected by instruction decoder 13 that produces write direct signal on signal line 58-1, which controls data selector 35 and input controller 19.

Software END instruction subroutine 122 reads data files provided on signal lines 121 and inserts an END machine instruction at the end of program memory 10 of the predefined sequencer, e.g. 9-1. The files are then fed via signal line 123 into device programming software subroutine 73 for direct loading into the sequencers 9-1 through 9-n as per FIG. 4. There are several ways to initialize data memory 14 contents which represents the initial design status. The simplest one is to provide device programming software 73 with the initialization data file 72 via signal lines 74. The initialization of data memory 14 starts with loading into the program memory 10 an output instruction, followed by a clock signal on signal line 62. If the address counter is inhibited from counting the clock on signal line 62, sequencer 9-1 will execute the currently loaded instruction and will set AND register 26 to logic one (1) and OR register 27 to logic zero (0). Following this, the device programming software subroutine 73 loads output instructions under control of initialization data file 72 into program memory 10 that address the desired locations in data memory 14. Each AND output instruction will thereafter place a one (1) at specified memory 14 address and each OR output instruction will place a zero (0) at specified memory 14 location.

The initialization of sequencer 9 can also be accomplished by loading initialization program 72 directly into program memory 10 above the END instruction. Loading address counter 3 with the address where the initialization instructions start and feeding clock signal on signal line 62 will execute the initialization instructions. Still another initialization option is to use an up-down address counter 3 and load the initialization instructions starting from the top of memory 10. To start initialization the address counter should be set to count down. To execute the Boolean equations related instructions, counter 3 should be set to count up.

If the machine instructions provided by subroutines 104, 114, 120, and 122 do not fit within a single Device 1, they are distributed over program memories of other devices such as devices 1-1, 1-2 and 1-m in FIG. 3. Distribution of machine code between multiple devices is performed as per software subroutines in FIG. 6. For example, if there are six (6) devices, each having sixteen (16) sequencers, then the total number of sequencers that will participate in processing of logic equations will be ninety six (96) and distribution subroutine 116 will divide machine instructions between ninety six (96) sequencers instead of sixteen (16) sequencers for a single device.

One can connect practically unlimited number of devices 1-1 through 1-m. However, they need to be synchronized as shown in FIG. 3. The device that stores the END instruction, e.g. device 1-1, is synchronizing all other devices such as 1-2 through 1-m by issuing END reset signal on signal line 54-1 and resetting the device reset controllers 5-2 through 5-m, respectively.

The architecture of the processing device per the invention disclosed herein is not limited to ASIC, FPGA or similar devices but is also applicable to devices construed with nanotechnology and other technologies in which the same principle of synchronized processing and information transfer by multiple processing units is utilized.

This invention is not to be limited by the embodiment shown in the drawings and described in the description which is given by way of example and not of limitation, but only in accordance with the scope of the appended claims.

What is claimed is:

1. A parallel processor for parallel processing of logic equations and arithmetic operations comprising;
   a plurality of sequencer means having a common clock for synchronizing operation of each sequencer of said plurality of sequencer means;
   each sequencer of said plurality of sequencer means having a single bit processor, input multiplexer, data memory for storing data produced by said single bit processor and a machine instruction decoder;
   common program memory storing machine instructions for processing logic equations, said common program memory comprising distributed program memory in each sequencer of said plurality of sequencers, machine instructions converted from logic equations stored in said distributed program memory, said machine instructions being distributed in approximately equal proportions between said distributed program memory in each sequencer of said plurality of sequencers;
   a common address counter for addressing said distributed program memory of at least two sequencers of said plurality of sequencers;
   a common reset line for resetting each sequencer of said plurality of sequencers;
   a selected sequencer of said plurality of sequencers having end-of-program recognition means for recognizing an end-of-program machine instruction, said end-of-program recognition means resetting said common address counter upon detection of said end-of program machine instruction;
   said instruction decoder of each said sequencer means including a no-operation recognition means for recognizing a no-operation machine instruction and inhibiting any action in a sequencer of said plurality of sequencers in which said no-operation machine instruction has been recognized;
   each sequencer of said plurality of sequencers including a data write controller and an input controller;
   said machine instruction decoder being constructed to detect set/reset machine instructions, said machine instruction decoder modifying operation of said data write controller upon detecting a set/reset instruction;
   said data write controller producing a write pulse output to said data memory only when an output of said single bit processor is at a predetermined logical state;
   said machine instruction decoder modifying operation of said input controller when a set/reset instruction is detected;
   said input controller producing a logical 1 and 0 depending upon the state of selected bits in a current machine instruction;
   said plurality of sequencers including in their said program memory initialization instructions for setting, data memory bits into a predetermined logical state, said initialization instructions being separated in each of said selected sequencers from the logic execution instructions by the said end-of-program machine instruction;
   said instruction decoder being responsive to said common program memory and controlling the operation of said input multiplexer, single bit processor and data memory;
   said single bit processor being responsive to said instruction decoder and input multiplexer and producing output data;
   said data memory storing the output data under control of said instruction decoder.

2. A parallel processor for parallel processing of logic equations and arithmetic operations comprising;
   a plurality of sequencer means having a common clock for synchronizing operation of each sequencer of said plurality of sequencer means;
   each sequencer of said plurality of sequencer means having a single bit processor, input multiplexer, data memory for storing data produced by said single bit processor and a machine instruction decoder;
   common program memory storing machine instructions for processing logic equations;
   said common program memory comprising distributed program memory in each sequencer of said plurality of sequencers, machine instructions converted from logic equations are stored in said distributed program memory, said machine instructions being distributed in approximately equally proportions between said distributed program memories in each sequencer of said plurality of sequencers;
   said input multiplexer of a first sequencer of said plurality of sequencer means being connected to receive a first selected output data signal from said single bit processor of a second sequencer of said plurality of sequencers;
   said program memory of first sequencer including a read machine instruction representing the calculated execution time and appearance time of said first selected output data signal for reading said first selected output data signal via said input multiplexer of said first sequencer;
   said first selected output data signal being stored in data memory of said first sequencer of said plurality of sequencer means;
   said instruction decoder being responsive to said common program memory and controlling the operation of said input multiplexer, single bit processor and data memory;

said single bit processor being responsive to said instruction decoder and input multiplexer and producing output data;

said data memory storing the output data under control of said instruction decoder.

3. A parallel processor for parallel processing of logic equations and arithmetic operations under control of a common clock comprising;

a plurality of sequencer means operating continuously and independently of each other having a common clock for synchronizing operation of each sequencer of said plurality of sequencer means;

each sequencer of said plurality of sequencer means having a single bit processor, input multiplexer, data memory for storing data produced by said single bit processor, common program memory for storing machine instructions for processing logic equations and arithmetic operations, and instruction decoder;

each sequencer of said plurality of sequencer means operating as an independent controller from other sequencers of said plurality of sequencer means and being responsive only to said common clock and machine instructions in its common program memory;

said instruction decoder being responsive to said common program memory and controlling operation of said input multiplexer, single bit processor and data memory, said instruction decoder processing each and every instruction in said program memory strictly in sequential order;

said single bit processor being responsive to said instruction decoder and said input multiplexer and producing output data;

said data memory storing the output data under control of said instruction decoder.

4. The processor according to claim 3 including a common address counter for addressing said common program memory.

5. The processor according to claim 4 in which a first and second sequencer of said plurality of sequencers means having in addition an input selector and arithmetic module;

an output of said input multiplexer and said arithmetic module of said first sequencer being connected to inputs of said input selector of said second sequencer;

said second sequencer having an output of said input selector connected to an input of said arithmetic module;

said second sequencer having an output of said input multiplexer connected to an input of said arithmetic module;

said arithmetic module of said second sequencer having an output connected to said data memory of said second sequencer;

said input multiplexer, arithmetic module and data memory of said first sequencer being responsive to the instruction decoder of said first sequencer and performing operations on data from said data memory, input multiplexer and arithmetic module under control of machine instructions stored in said program memory of said first sequencer;

said input selector, arithmetic module and data memory of said second sequencer being responsive to the instruction decoder of said second sequencer and performing operations on input data under control of machine instructions stored in said program memory of said second sequencer.

6. The processor according to claim 5 in which the said arithmetic module is a programmable arithmetic module;

said instruction decoder detecting arithmetic reconfiguration instructions and reconfiguring said arithmetic programmable module.

7. The processor according to claim 3 in which said common program memory is comprised of distributed program memory in each sequencer of said plurality of sequencers; said distributed program memory receiving and storing machine instructions converted from logic equations and arithmetic operations, said machine instructions being distributed in approximately equally proportioned between said distributed program memory in each sequencer of said plurality of sequencers.

8. The processor according to claim 7 including a common address counter for addressing said distributed program memory of at least two sequencers of said plurality of sequencers.

9. The processor according to claim 8 including a common reset line for resetting each sequencer of said plurality of sequencers.

10. The processor according to claim 9 including a selected sequencer of said plurality of sequencers having end-of-program recognition means for recognizing an end-of-program machine instruction, said end-of-program recognition means resetting said common address counter upon detection of said end-of program machine instruction.

11. The processor according to claim 9 a selected sequencer of said plurality of sequencers having end-of-program recognition means for recognizing an end-of-program machine instruction, said end-of-program recognition means presetting said common address counter to a predetermined count upon detection of said end-of-program machine instruction.

12. The processor according to claim 11 in which said plurality of sequencers include in their said program memory initialization instructions for setting data memory bits into a predetermined logical state; said initialization instructions being separated in each of said selected sequencers from the logic execution instructions by the said end-of-program machine instruction.

13. The processor according to claim 9 in which said instruction decoder of each said sequencer means includes no-operation recognition means for recognizing a no-operation machine instruction and inhibiting any action by said single bit processor in a sequencer of said plurality of sequencers in which said no-operation machine instruction has been recognized.

14. The processor according to claim 13 in which each sequencer of said plurality of sequencers includes a data write controller and an input controller;

said machine instruction decoder being constructed to detect set/reset machine instructions, said machine instruction decoder modifying operation of said data write controller upon detecting a set/reset instruction;

said data write controller producing a write pulse output to said data memory only when an output of said single bit processor is at a predetermined logical state;

said machine instruction decoder modifying operation of said input controller when a set/reset instruction is detected;

said input controller producing a logical 1 and 0 depending upon the state of selected bits in a current machine instruction.

15. The processor according to claim 8 in which said common address counter is an up-down counter.

16. The processor according to claim 3 in which at least a first sequencer of said plurality of sequencer means has a data selector; said data selector of said first sequencer being connected to receive a first selected output data signal from said single bit processor of a second sequencer of said plurality of sequencers; said program memory of at least said first sequencer including a read machine instruction representing the calculated execution time and appearance time of said first selected output data signal for reading said first selected output data signal via said data selector of said first sequencer.

17. The processor according to claim 16 in which said first selected output data signal is stored in data memory of said first sequencer of said plurality of sequencer means under control of said instruction decoder of said first sequencer of said plurality of sequencers.

18. The processor according to claim 16 in which said end-of-program recognition means presetting said common address counter to a predetermined count upon detection of said end-of-program machine instruction.

19. The processor according to claim 3 in which said input multiplexer of a first sequencer of said plurality of sequencer means is connected to receive a first selected output data signal from said single bit processor of a second sequencer of said plurality of sequencers;

said program memory of first sequencer including a read machine instruction representing the calculated execution time and appearance time of said first selected output data signal for reading said first selected output data signal via said input multiplexer of said first sequencer;

said first selected output data signal being stored in data memory of said first sequencer of said plurality of sequencer means.

* * * * *